(12) United States Patent
Nose et al.

(10) Patent No.: US 8,004,268 B2
(45) Date of Patent: Aug. 23, 2011

(54) SIGNAL MEASURING DEVICE

(75) Inventors: Koichi Nose, Tokyo (JP); Masayuki Mizuno, Tokyo (JP)

(73) Assignee: NEC Corporation, Tokyo (JP)

( * ) Notice: Subject to any disclaimer, the term of this patent is extended or adjusted under 35 U.S.C. 154(b) by 569 days.

(21) Appl. No.: 12/088,411

(22) PCT Filed: Sep. 28, 2006

(86) PCT No.: PCT/JP2006/319348
§ 371 (c)(1),
(2), (4) Date: Mar. 27, 2008

(87) PCT Pub. No.: WO2007/037338
PCT Pub. Date: Apr. 5, 2007

(65) Prior Publication Data
US 2009/0189596 A1    Jul. 30, 2009

(30) Foreign Application Priority Data

Sep. 28, 2005    (JP) ................................. 2005-282631

(51) Int. Cl.
*G01R 25/00* (2006.01)
*G01R 19/00* (2006.01)
(52) U.S. Cl. .................. 324/76.77; 324/76.33
(58) Field of Classification Search ............... 324/76.77, 324/76.33
See application file for complete search history.

(56) References Cited

U.S. PATENT DOCUMENTS

| 6,052,701 | A | * | 4/2000 | Koslov et al. | 708/313 |
| 6,172,628 | B1 | * | 1/2001 | Sculley et al. | 341/120 |
| 7,339,990 | B2 | * | 3/2008 | Hidaka | 375/233 |
| 7,515,670 | B2 | * | 4/2009 | Ettorre et al. | 375/371 |
| 2003/0034984 | A1 | * | 2/2003 | Murata | 345/589 |
| 2006/0133523 | A1 | * | 6/2006 | Stojanovic et al. | 375/260 |

FOREIGN PATENT DOCUMENTS

| JP | 09005362 | 1/1997 |
| JP | 10160507 | 6/1998 |
| JP | 2000111587 | 4/2000 |
| JP | 2002064384 | 2/2002 |
| JP | 2003087113 | 3/2003 |

* cited by examiner

*Primary Examiner* — Jeff Natalini
(74) *Attorney, Agent, or Firm* — Sughrue Mion, PLLC

(57) ABSTRACT

An interpolated signal generating circuit (101) generates interpolated signals ($SIG_1$-$SIG_N$) of two consecutive discrete signals (SIG). N measuring circuits (501) measure interpolated signals. Since the interpolated signals are measurement targets, N-times oversampling measurement can also be performed for the discrete signals. With the oversampling measurement, the frequency spectra of the signal components of the discrete signals are maintained, and only the frequency spectrum of a noise component due to a quantization error increases to a high-frequency band, thereby reducing a noise component per unit frequency. Therefore, removing a high-frequency component from a measurement result from each measuring circuit using a low-pass filter (502) makes it possible to improve the signal-to-noise ratio of the measurement result as compared with a case in which no oversampling is performed.

10 Claims, 16 Drawing Sheets

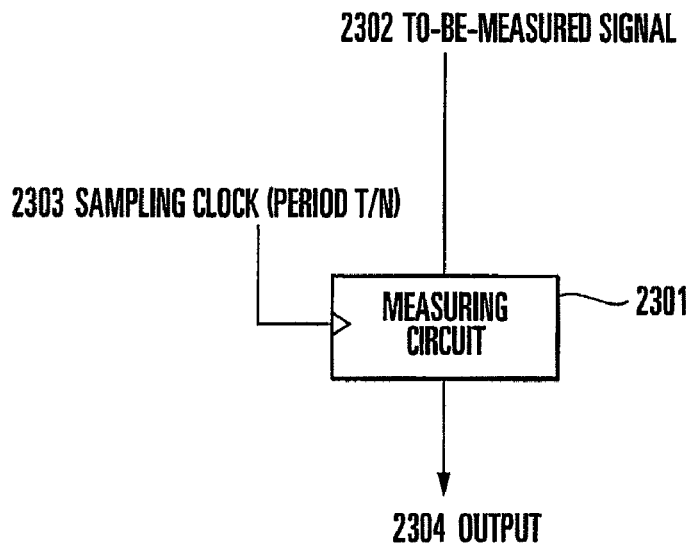
F I G. 24
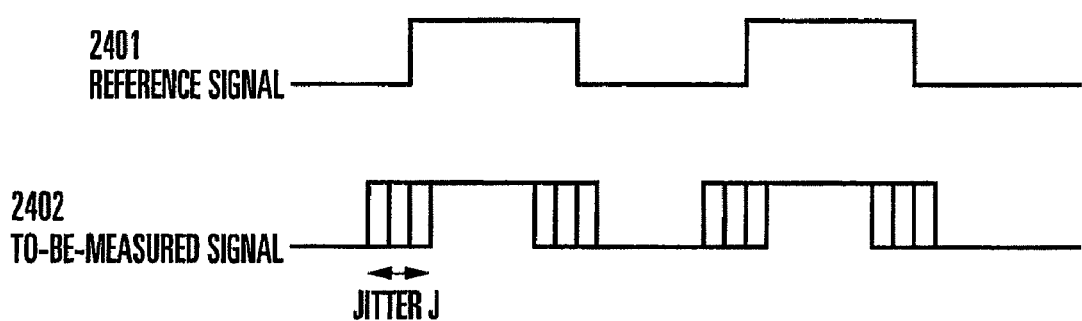
F I G. 25

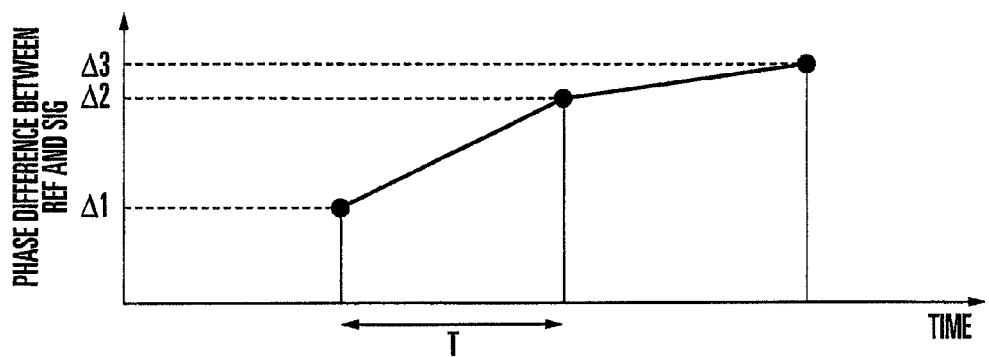
F I G. 28
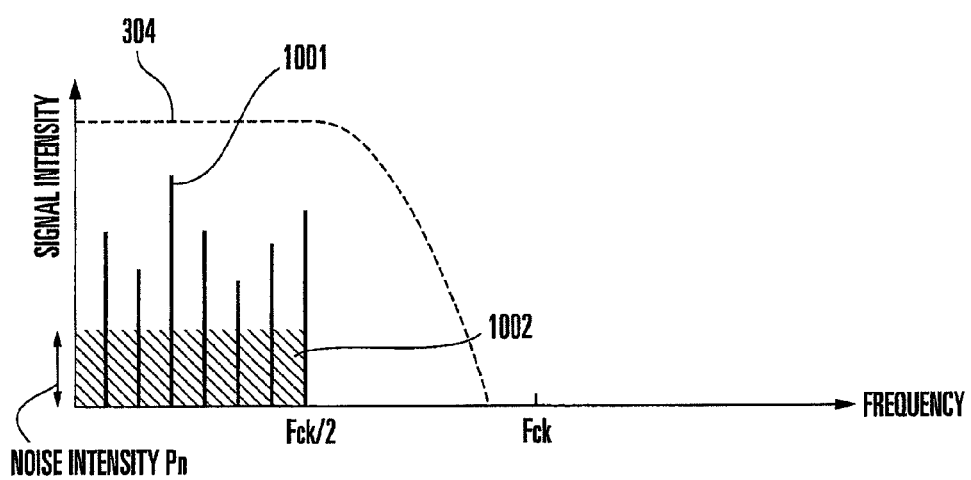
F I G. 29

SIGNAL MEASURING DEVICE

TECHNICAL FIELD

The present invention relates to a signal measuring device which is used to, for example, measure phase differences in, for example, an integrated circuit.

BACKGROUND ART

Recently, increases in the speed and complexity of integrated circuits have worsened the problems of operation failure, a decrease in operating band, and the like due to noise in chips, variations in chip noise, temporal fluctuations in clock phase (jitter), and the like. Conventionally, signals are extracted outside an integrated circuit, and the behaviors of the signals are observed. Although the operating frequencies of integrated circuits have increased year by year, the operating frequencies of boards and packages outside the integrated circuits have not followed the increasing speeds. It is therefore difficult to observe high-speed operation in integrated circuits on the outside of the integrated circuits. Therefore, greater importance has been attached to a technique of observing internal operation by providing a measuring circuit in a chip.

FIG. 17 shows a conventional measuring circuit provided in a chip. A measuring circuit 1801 is driven by a sampling clock 1804 to operate at every period T. More specifically, this circuit compares the value of a to-be-measured signal 1802 with the value (m×Td) of a reference signal 1803 to obtain m by which the magnitude relation between the to-be-measured signal 1802 and the reference signal 1803 is reversed. The circuit then sets m as an output 1805 to estimate that the value of the to-be-measured signal 1802 is (m×Td). In this case, m represents an integer, and Td represents reference value intervals, i.e., a resolution.

This method uses analog/digital conversion to convert the to-be-measured signal 1802 which is a continuous value into the digital value m, and hence need not output any analog signal which is susceptible to noise and difficult to measure. A problem in this method is that errors (quantization errors) corresponding to Td at maximum occur between values 1904, 1905, and 1906 (m×Td+Δa, (m+1)×Td+Δb, and m×Td+Δc) of to-be-measured signals and measurement results (m, m+1, and m), as shown in FIG. 18.

To-be-measured signals include two types of signals, i.e., a continuous signal and a discrete signal. There are different noise countermeasures for the respective measurements. A continuous signal is a continuous value like noise on a power supply line. A discrete signal is a value generated only once at the period T like that of the timing fluctuation (jitter) of a clock.

For the measurement of continuous signals, there is available an oversampling measurement technique of using an array of N measuring circuits 2002 and setting the operation timings of them to N-phase clocks CK1 to CKN with the period T. In this case, since the N measuring circuits 2002 can detect the value of to-be-measured signals 2001 at every time T/N, the sampling frequency becomes N times higher than that in the case in which one measuring circuit is used.

FIG. 20 shows sampling timings when oversampling is performed. FIG. 21 shows sampling timings when no oversampling is performed. Reference numeral 2101 denotes a to-be-measured signal; and 2102 to 2104, sampling timings. Reference symbols D1 to D4 denote sampling timings.

FIG. 22 shows the frequency spectrum converted from the measurement result in FIG. 20. FIG. 23 shows the frequency spectrum converted from the measurement result in FIG. 21. Reference numerals 301 and 401 denote the spectra of signals; 302 and 402, noise components; and 304, the cutoff characteristic of a low-pass filter. Reference symbol Fck denotes the operating frequency (1/T) of a signal.

As is obvious from the sampling theorem, using the above oversampling processing makes it possible to measure up to a high-frequency component N times higher in frequency than that in the case in which one measuring circuit is used. With oversampling processing, although the band of a noise component, in particular, extends to a high frequency, the intensity of the component per unit frequency decreases. As shown in FIG. 22, therefore, the signal-to-noise ratio can be improved by cutting off the high-frequency component of the noise component 302 using a low-pass filter.

According to another measuring method, as shown in FIG. 24, using a measuring circuit 2301 capable of operating at a period T/N and a sampling clock 2303 with the period T/N allows one measuring circuit 2301 to implement the same measurement as that described above. Reference numeral 2302 denotes a to-be-measured signal; and 2304, an output.

An example of a discrete signal is clock jitter J like that shown in FIG. 25, which indicates how much the phase of a to-be-measured signal 2402 shifts from that of a reference signal 2401 at maximum.

A method of measuring this clock jitter is disclosed in, for example, Japanese Patent Laid-Open No. 2000-111587 (reference 1). As shown in FIG. 26, a to-be-measured signal SIG is made to pass through a plurality of delay elements 2501 each having a delay value Ts to shift the phase of the to-be-measured signal SIG by Ts at a time. Flip-flops 2502, 2503, 2504, . . . then compare these phases of the to-be-measured signal SIG with a reference signal REF. If the to-be-measured signal SIG is shifted from the reference signal REF by a time Tjit, the flip-flops 2502 and 2503 respectively receive phase differences Tjit and Tjit−Ts. Each of the flip-flops 2502, 2503, 2504, . . . is a circuit which outputs "1" when the phase difference is 0 or more, and outputs "0" otherwise. If a phase difference Tjit−N×Ts is 0 or less, the (N+1)th flip-flop outputs "0" for the first time. Observing this result will determine the value of N. Outputting the value N makes it possible to measure that Tjit is about N×Ts.

In this method, as shown in FIG. 27, errors (quantization errors) corresponding to Td at maximum occur between phase differences 804, 805, and 806 (m×Td+Δa, (m+1)×Td+Δb, and m×Td+Δc) between the reference signal REF and the to-be-measured signal SIG and measurement results (m, m+1, and m). Such an error component becomes quantization noise, which is a cause of deterioration in signal-to-noise ratio.

In addition, as shown in FIG. 28, this method performs one measurement at every period T of the reference signal REF and to-be-measured signal SIG to obtain phase differences Δ1, Δ2, Δ3, . . . FIG. 29 shows this jitter value information in a spectral form, in which a signal component 1001 and a quantization noise component 1002 occur in a frequency band equal to or less than Fck/2 which is half a sampling frequency Fck (equal to a clock frequency 1/T of the to-be-measured signal) (the quantization noise component 1002 uniformly exists in the band of a frequency of 0 to a frequency of Fck/2). If a low-pass filter having the cutoff characteristic indicated by a dotted line 304 is used to remove the quantization noise component 1002, the filter degrades the signal component 1001 as well. This makes it impossible to use the filter, and hence quantization noise cannot be reduced.

Unlike in a continuous signal, in a discrete signal, the interval of a to-be-measured signal does not exist in the period T or less. The oversampling technique, which measures a to-be-measured signal at a period shorter than the period T, cannot be directly applied to a discrete signal. In order to reduce noise due to an error, it is, therefore, necessary to design a measuring instrument which can reduce a quantization error Ts.

In general, however, as the measurement resolution of a measuring instrument increases (Ts decreases), the operation of the instrument becomes complicated, and more outputs are required. In addition, the operation speed of the measuring instrument has its upper limit, and the frequency band which allows output signals to be extracted to the outside of the integrated circuit also has its upper limit. It is therefore very difficult to achieve a high resolution by using the conventional methods.

DISCLOSURE OF INVENTION

Problem to be Solved by the Invention

As described above, according to the measuring method used for the above conventional integrated circuit, when a signal value generated at every discrete time (interval T) is to be measured, high-resolution measurement with a small quantization error requires complicated operation, and the required output amount increases. It is therefore difficult to implement such measurement.

It is, therefore, an object of the present invention to provide a signal measuring device which allows oversampling measurement to be performed in measurement of a signal value generated at every discrete time (interval T), and improves the signal-to-noise ratio.

Means of Solution to the Problem

A signal measuring device according to the present invention is characterized by comprising an interpolated signal generating circuit which receives discrete signal as measurement targets and generates interpolated signals of two consecutive discrete signals, and a measuring circuit which receives the discrete signals and the interpolated signals generated by the interpolated signal generating circuit, and outputs a result obtained by measuring the discrete signals and the interpolated signals.

Effects of the Invention

According to the signal measuring device according to the present invention, since the interpolated signals generated by the interpolated signal generating circuit are measurement targets, oversampling measurement can be substantially implemented. Therefore, the signal-to-noise ratio can be improved, and the measurement accuracy can be improved.

BRIEF DESCRIPTION OF DRAWINGS

FIG. 24 is a block diagram showing another example of the arrangement of the circuit for implementing oversampling for a conventional continuous signal;

FIG. 25 is a timing chart for showing the definition of jitter;

FIG. 28 is a graph showing phase differences along the time axis; and

FIG. 29 is a graph showing the phase differences converted into a frequency spectrum.

BEST MODE FOR CARRYING OUT THE INVENTION

The embodiments of the present invention will be described below with reference to the accompanying drawings.

First Embodiment

Figure 1:
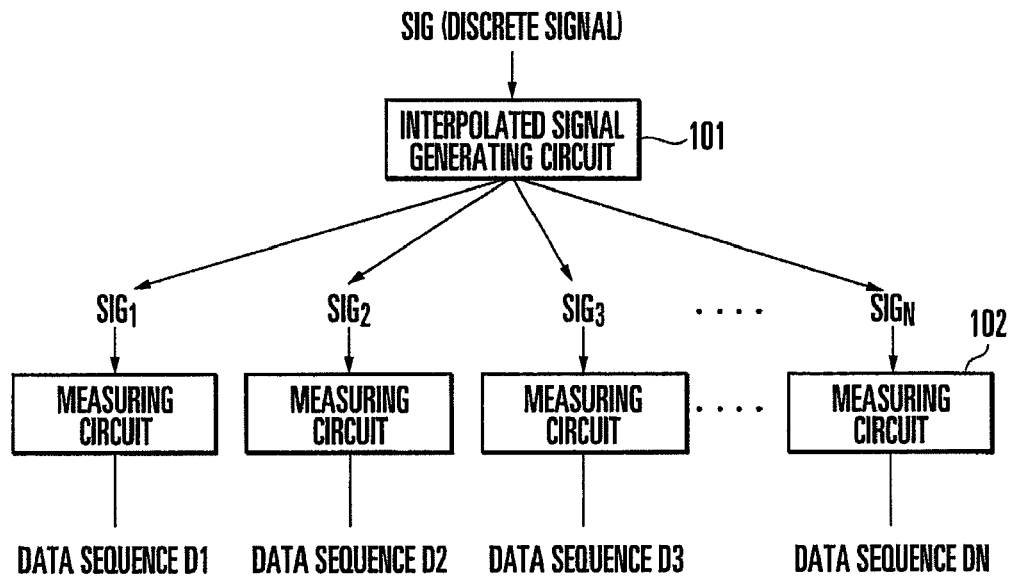
FIG. 1 is a block diagram showing the arrangement of a signal measuring device according to the first embodiment of the present invention.

FIG. 1 is a block diagram showing the arrangement of a signal measuring device according to the first embodiment of the present invention. The signal measuring device shown in FIG. 1 comprises an interpolated signal generating circuit 101 and N (N is an integer equal to or more than 2) measuring circuits 102.

The interpolated signal generating circuit 101 generates interpolated signals $SIG_1$, $SIG_2$, $SIG_3$, ..., $SIG_N$ by interpolating two consecutive signals A(i) and A(i+1), where A(i) is the ith signal value, of a to-be-measured signal (discrete signal) SIG generated once at every period (discrete time) T. The kth (k is an integer from 1 to N) interpolated signal $SIG_K$ has a median value represented by expression (1), which is obtained by linearly interpolating the two consecutive signals A(i) and A(i+1).

$$Ai + \{(Ai+1-Ai)/N\} \times (k-1) \quad (1)$$

As is also obvious from expression (1), the first interpolated signal $SIG_1$ is identical to the to-be-measured signal SIG which is the source of other interpolated signals $SIG_2$ to $SIG_N$. Note that interpolated signals can be generated by interpolating the two consecutive signals A(i) and A(i+1) in accordance with a predetermined function instead of linear interpolation. The kth interpolated signal $SIG_K$ is distributed to the kth measuring circuit.

The measuring circuits 102 respectively measure the interpolated signals $SIG_1$ to $SIG_N$ generated by the interpolated signal generating circuit 101, and output data sequences D1, D2, D3, ..., DN as measurement results. In other words, the measuring circuits 102 measure the to-be-measured signal SIG and interpolated signals $SIG_2$ to $SIG_N$, and output the measurement results. "Measurement" by the measuring circuits 102 includes quantization of the to-be-measured signal SIG and interpolated signals $SIG_2$ to $SIG_N$ into digital signals.

Figure 2:
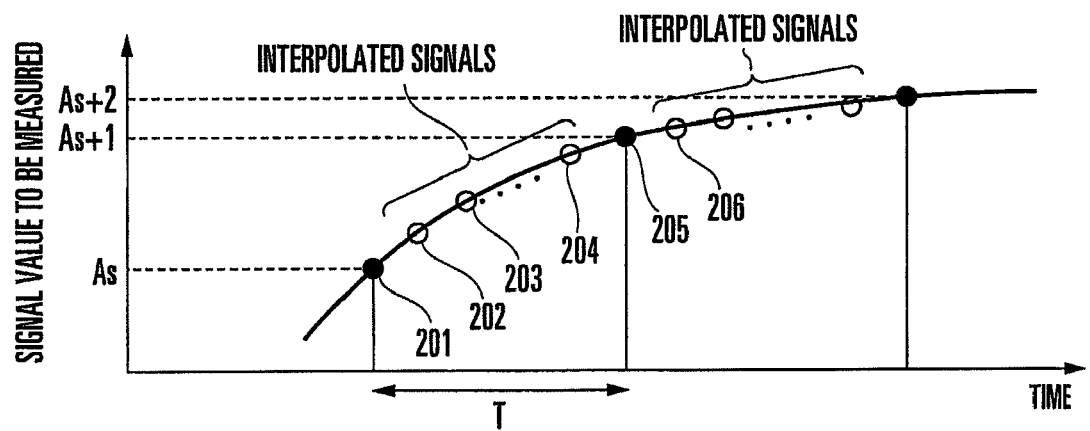
FIG. 2 is a graph showing interpolated signals along the time axis in FIG. 1.

This embodiment can obtain a plurality of measurement results 202, 203, and 204 in a time T as shown in FIG. 2 by generating interpolated signals using the interpolated signal generating circuit 101 when measuring a signal generated once at every discrete time T. This can improve the sampling frequency to N/T (oversampling).

Figure 3:
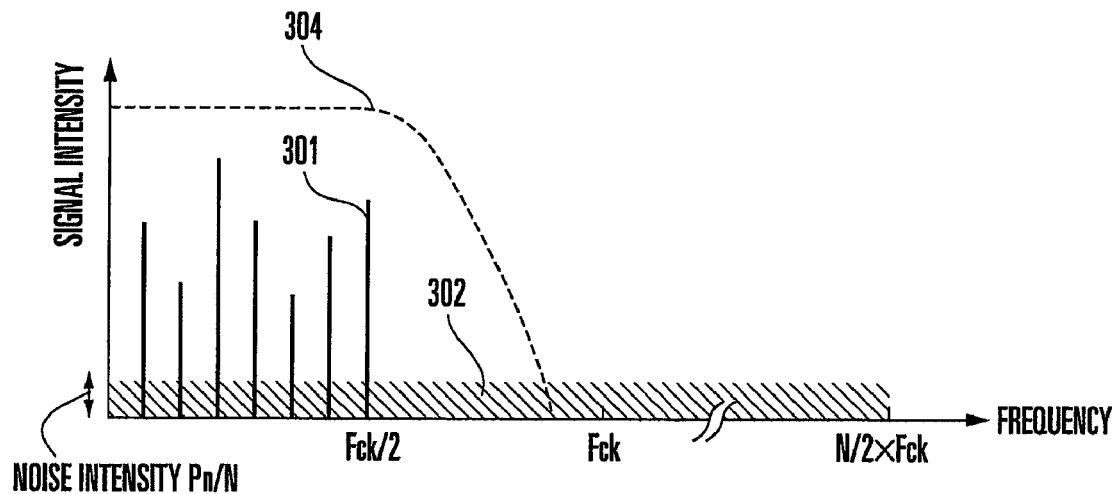
FIG. 3 is a graph showing a frequency spectrum when oversampling is performed.
Figure 4:
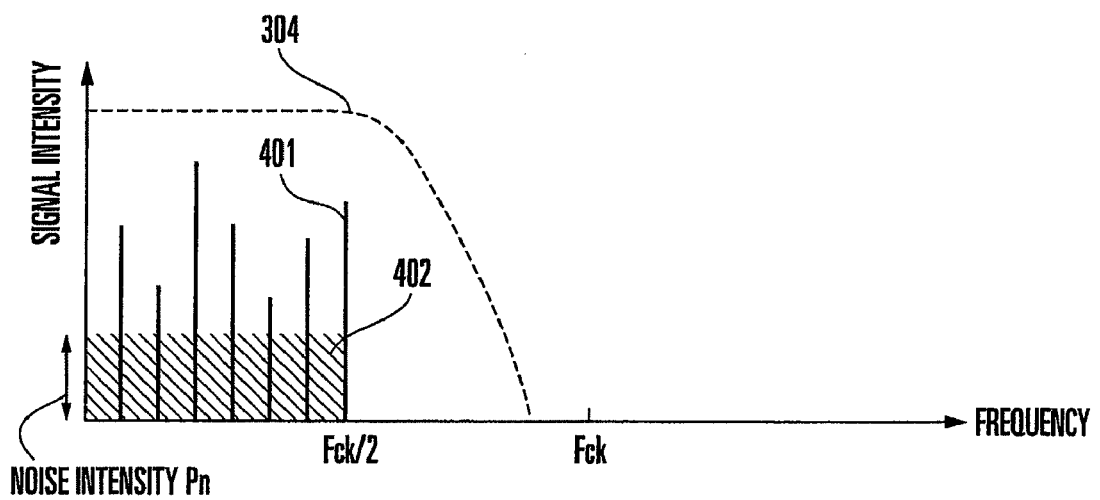
FIG. 4 is a graph showing a frequency spectrum when no oversampling is performed.

As is obvious from the comparison between the frequency spectrum shown in FIG. 3, which is obtained when oversampling is performed, and the frequency spectrum shown in FIG. 4, which is obtained when no oversampling is performed, signal spectra 301 and 401 are identical. Note, however, that the signal band is from 0 to Fck/2, and Fck represents the operating frequency (1/T) of a signal.

Without oversampling, the band of noise 402 is distributed from 0 to Fck/2. In contrast, with oversampling, the band of noise 302 extends from 0 to N×Fck/2, and the quantization noise per unit frequency is reduced to 1/N as compared with the case in which no oversampling is performed. That is, the signal-to-noise ratio in the band (0 to Fck/2) in which a signal exists is improved by N times.

Second Embodiment

Figure 5:
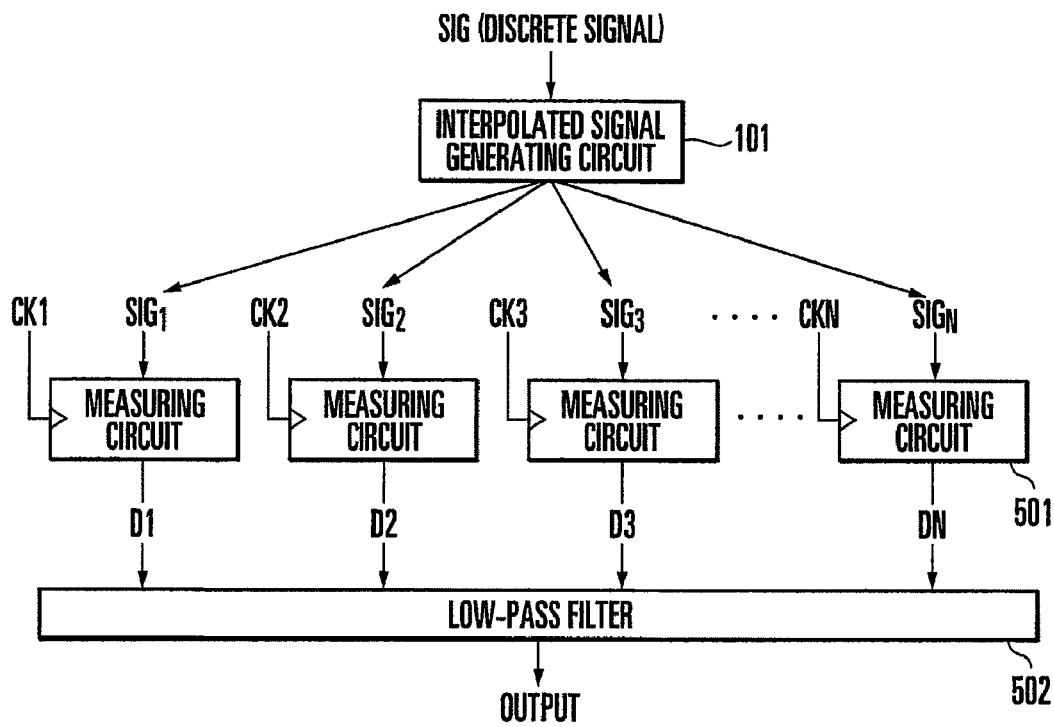
FIG. 5 is a block diagram showing the arrangement of a signal measuring device according to the second embodiment of the present invention.

FIG. 5 is a block diagram showing the arrangement of a signal measuring device according to the second embodiment of the present invention. The signal measuring device shown in FIG. 5 comprises an interpolated signal generating circuit 101, N measuring circuits 501, and a low-pass filter (data conversion circuit) 502. The interpolated signal generating circuit 101 is the same as the interpolated signal generating circuit 101 in FIG. 1.

The measuring circuits 501 respectively operate at a period T in accordance with n-phase clocks CK1, CK2, ..., CKN each having a frequency 1/T to measure interpolated signals $SIG_1$ to $SIG_N$ generated by the interpolated signal generating circuit 101. The measuring circuits 501 then output data sequences D1, D2, D3, ..., DN as measurement results.

The low-pass filter 502 cuts off the high-frequency components of the values of the data sequences D1 to DN output from the N measuring circuits 501. The low-pass filter 502 has the cutoff characteristic indicated by a dotted line 304 in FIG. 3. This filter can therefore remove a high-frequency component exceeding Fck of noise 302 whose band is extended by oversampling. This makes it possible to remove only the noise component without attenuating the signal component and further improve the signal-to-noise ratio.

Third Embodiment

Figure 6:
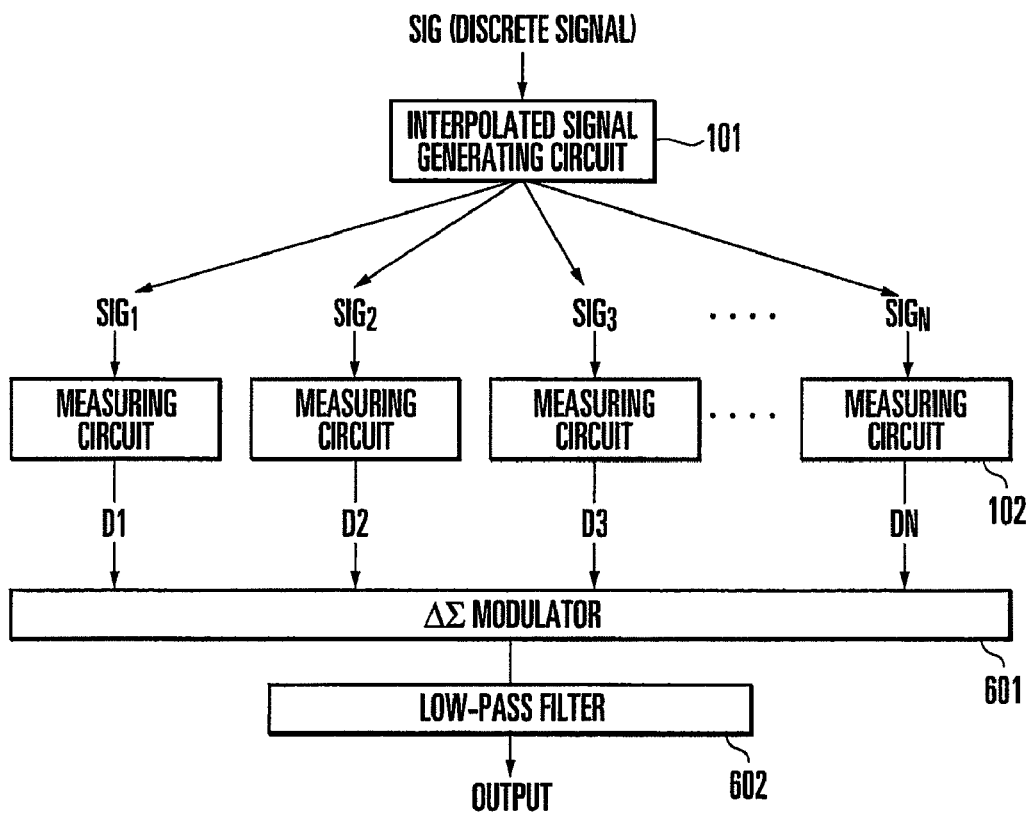
FIG. 6 is a block diagram showing the arrangement of a signal measuring device according to the third embodiment of the present invention.
Figure 7:
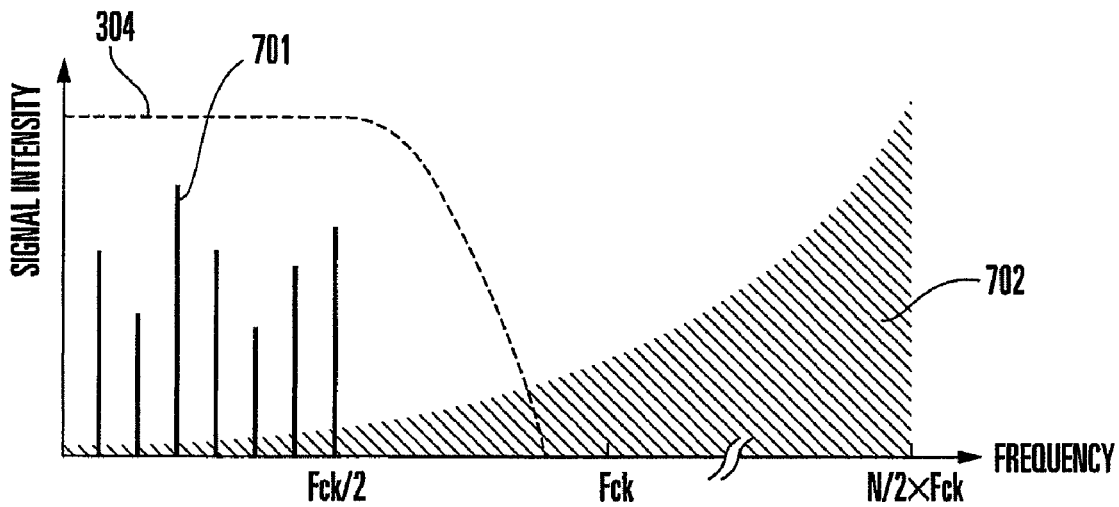
FIG. 7 is a graph showing a frequency spectrum in the third embodiment.

FIG. 6 is a block diagram showing the arrangement of a signal measuring device according to the third embodiment of the present invention. The signal measuring device shown in FIG. 6 is obtained by adding, to the signal measuring device shown in FIG. 1, a data conversion circuit which removes noise from data sequences D1 to DN from the signal measuring device shown in FIG. 1 and outputs the resultant data. This data conversion circuit comprises a ΔΣ modulator 601 and a low-pass filter 602. The ΔΣ modulator 601 performs ΔΣ modulation for output data sequences D1 to DN. FIG. 7 shows the frequency spectrum obtained by ΔΣ modulation. The frequency distribution of noise 702 disproportionately overlaps the high-frequency band region (noise shaping). Therefore, removing the high-frequency band noise using the low-pass filter 602 can further reduce the noise component. Note that it is possible to obtain the effect of improving the signal-to-noise ratio without using the low-pass filter 602. Referring to FIG. 7, reference numeral 701 denotes a signal spectrum.

Fourth Embodiment

Figure 8:
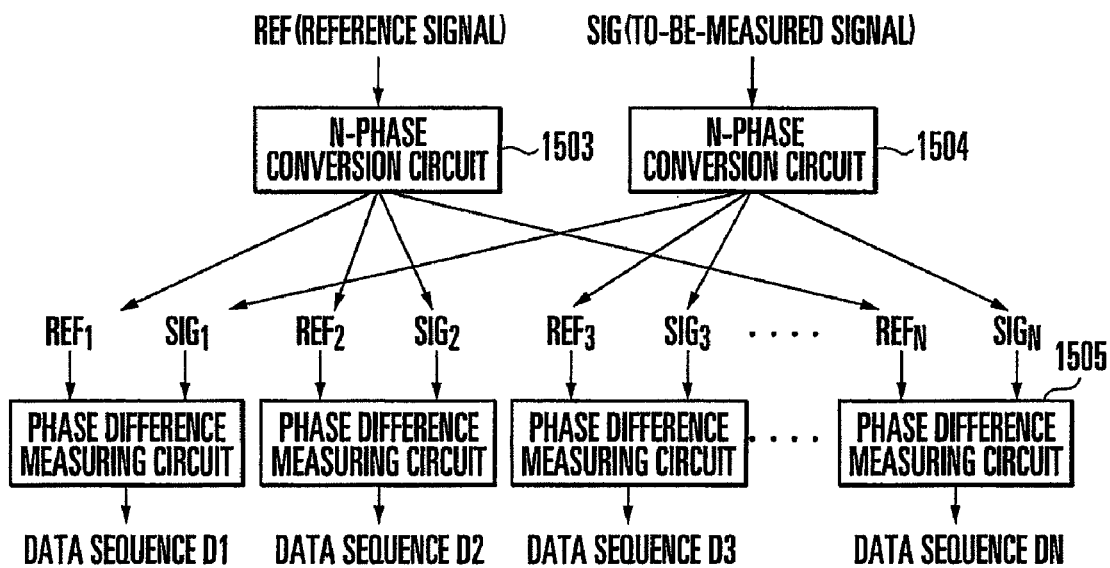
FIG. 8 is a block diagram showing the arrangement of a jitter measuring device according to the fourth embodiment of the present invention.

A case in which the first embodiment of the present invention is applied to a clock timing fluctuation (jitter) measuring device will be described next. Jitter indicates how much the phase of a to-be-measured signal SIG fluctuates relative to the phase of a reference signal REF, as shown in FIG. 25. FIG. 8 is a block diagram showing the arrangement of a jitter measuring device according to the fourth embodiment of the present invention. This jitter measuring device comprises two N-phase clock conversion circuits 1503 and 1504 as interpolated signal generating circuits and N phase difference measuring devices 1505.

The first N-phase conversion circuit 1503 receives the reference signal (the first clock signal) REF, generates N (first to Nth) interpolated signals (N-phase clocks) $REF_1$, $REF_2$, $REF_3$, ..., $REF_N$ by interpolating the phase difference between the two consecutive reference signals REF with k:N−k (k are all integers from 1 to N), and outputs the signals to the N phase difference measuring devices 1505, respectively. The second N-phase conversion circuit 1504 receives the to-be-measured signal (the second clock signal) SIG, generates N (first to Nth) interpolated signals (N-phase clocks) $SIG_1$, $SIG_2$, $SIG_3$, ..., $SIG_N$ by interpolating the phase difference between the two consecutive to-be-measured signals SIG with k:N−k (k are all integers from 1 to N), and outputs the signals to the N phase difference measuring devices 1505, respectively. Note that the reference signal and the to-be-measured signal have the same average period.

Figure 9:
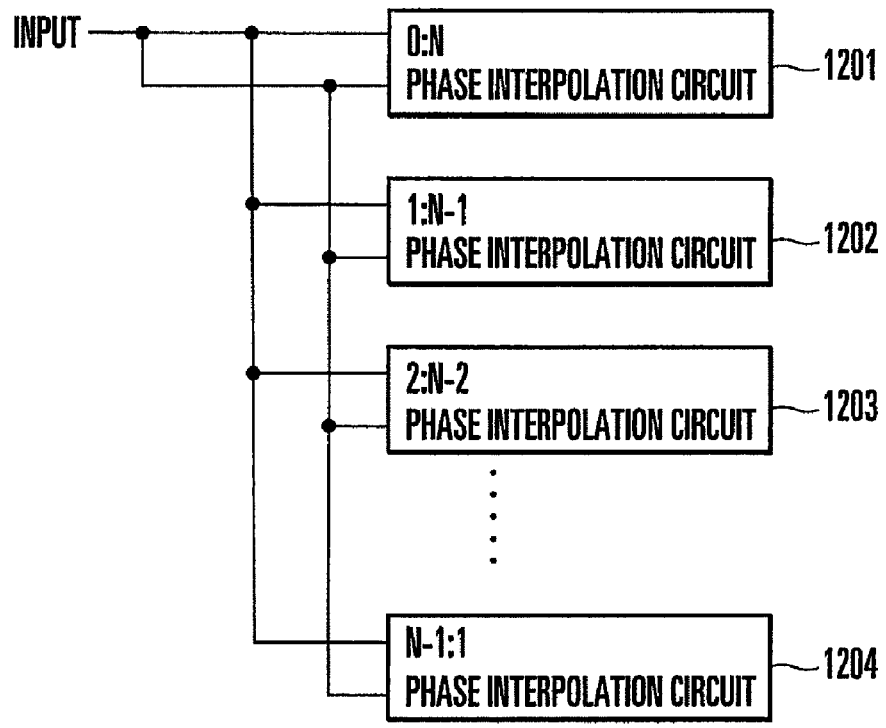
FIG. 9 is a block diagram showing an example of the arrangement of an N-phase clock generating circuit.

For example, as shown in FIG. 9, the N-phase clock conversion circuits 1503 and 1504 each can comprise N phase interpolation circuits 1201, 1202, 1203, ..., 120N having a common input.

Figure 10:
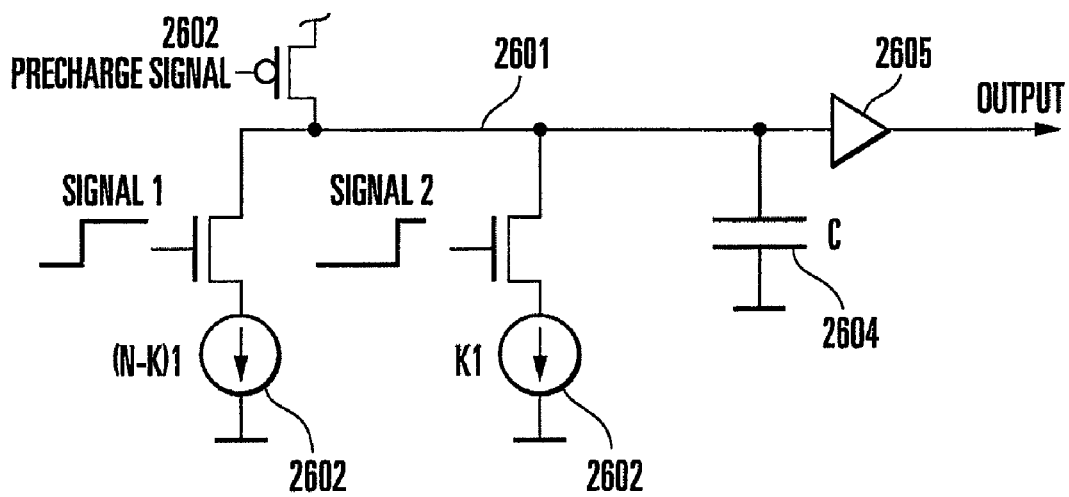
FIG. 10 is a block diagram showing an example of the arrangement of a phase interpolation circuit.

FIG. 10 shows an example of the arrangement of each of the phase compensation circuits 1201 to 120N, which is disclosed in Japanese Patent Laid-Open No. 2003-87113 (reference 2). This phase compensation circuit divides the current ratio between a constant current source 2602 and a constant current source 2603 into (N−k):k, thereby outputting the phase obtained by dividing the phase difference between clock signals 1 and 2 by k:N−k.

The N-phase clock conversion circuits 1503 and 1504 shown in FIG. 9 each use N phase compensation circuits each shown in FIG. 10. The first phase compensation circuit 1201 outputs the phase obtained by dividing the phase difference between the ith rising clock edge (time T1) of an input signal and the (i+1)th rising clock edge (time T2) into 0:N. The second phase compensation circuit 1202 outputs the phase obtained by dividing the phase difference between the ith rising clock edge of an input signal and the (i+1)th rising clock edge into 1:N−1. In this manner, the phase to be output is changed.

An output timing tk of the kth phase compensation circuit which divides the phase difference between the ith rising clock edge of the input signal and the (i+1)th rising clock edge into (k−1):N−(k−1) is represented by $$tk = [\{N-(k-1)\}/N] \times T1 + \{(k-1)/N\} \times T2 \quad (2)$$

More specifically, the output timing of the first phase compensation circuit 1201 which divides the phase difference into 0:N is represented by t1=T1, the output timing of the second phase compensation circuit 1202 which divides the phase difference into 1:N−1 is represented by t2=(N−1)/N×T1+1/N×T2, the output timing of the third phase compensation circuit 1203 which divides the phase difference into 2:N−2 is represented by t3=(N−2)/N×T1+2/N×T2, and the output timing of the Nth phase compensation circuit 120N which divides the phase difference into N−1:1 is represented by tN=1/N×T1+(N−1)/N×T2.

Figure 11:
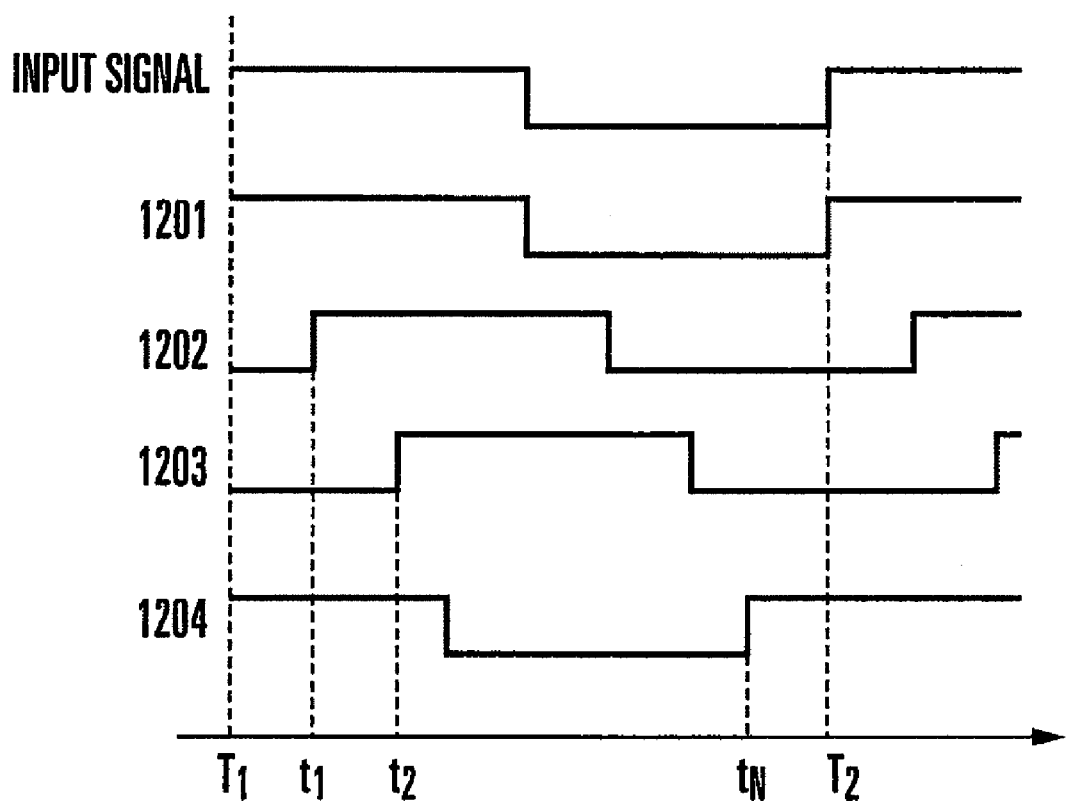
FIG. 11 is a timing chart showing N-phase clocks output from an N-phase clock generating circuit.

The output signals (N clocks) from the N phase interpolation circuits 1201 to 120N therefore become N-phase clocks (T2−T1=T (clock period)) which differ in phase from each other by (T2−T1)/N, as shown in FIG. 11.

The phase difference measuring devices 1505 respectively receive interpolated signals with the same numbers from the first and second N-phase clock conversion circuits 1503 and 1504, and measure the phase differences (time differences) between the interpolated signals with the same numbers, thereby obtaining N output data D1, D2, D3, ..., DN. For example, the kth phase different measuring circuit 1505 measures the phase difference between the kth interpolated signal $REF_K$ and the interpolated signal $SIG_K$.

Figure 26:
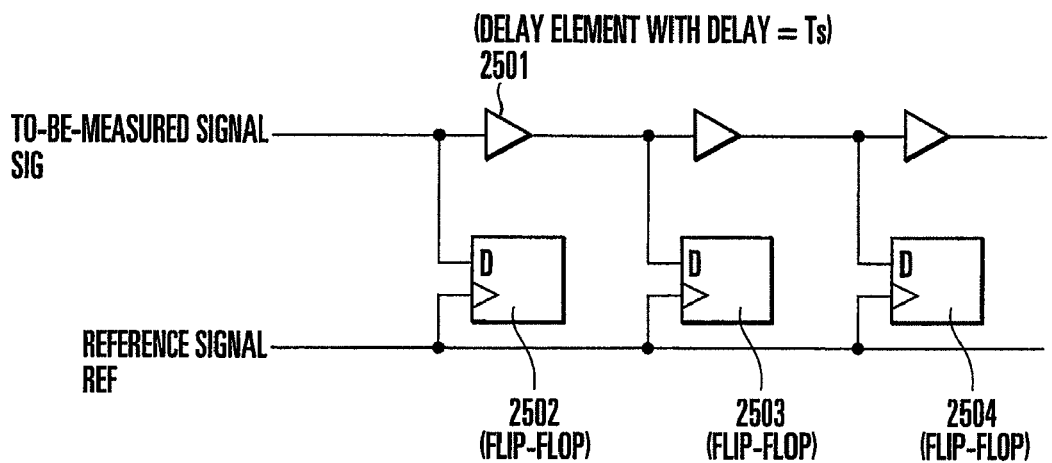
FIG. 26 is a block diagram showing the arrangement of a jitter measuring circuit.
Figure 27:
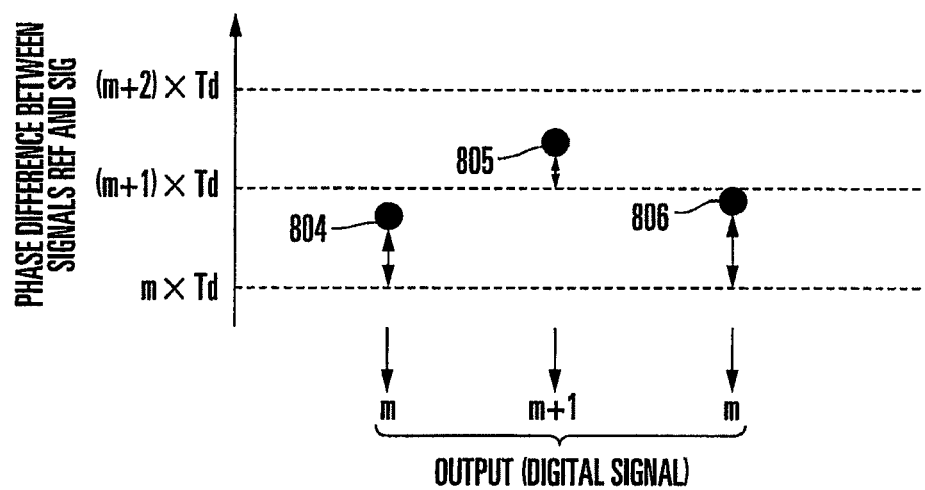
FIG. 27 is a view showing quantization noise generated when a conventional phase difference measuring circuit is used.

As shown in FIG. 26, the phase difference measuring devices 1505 each can comprise a plurality of delay elements 2501 each having a delay value Ts and a plurality of flip-flops 2502, 2503, 2504, .... The to-be-measured signal SIG is made to pass through the plurality of delay elements 2501 to shift the phase of the signal by Ts at a time, and the flip-flops 2502, 2503, 2504, ... compare the phases of the interpolated signals $SIG_K$ and the phases of the interpolated signals $REF_K$ of the reference signal REF. If the interpolated signal $SIG_K$ is shifted from the interpolated signal $REF_k$ by a time Tjit, the flip-flops 2502 and 2503 respectively receive phase differences Tjit and Tjit−Ts. Each of the flip-flops 2502, 2503, 2504, ... is a circuit which outputs "1" when the phase difference is 0 or more, and outputs "0" otherwise. If a phase difference Tjit−N×Ts is 0 or less, the (N+1)th flip-flop outputs "0" for the first time. Observing this result will determine the value of N. Outputting the value N makes it possible to measure that Tjit is about N×Ts.

Figure 12:
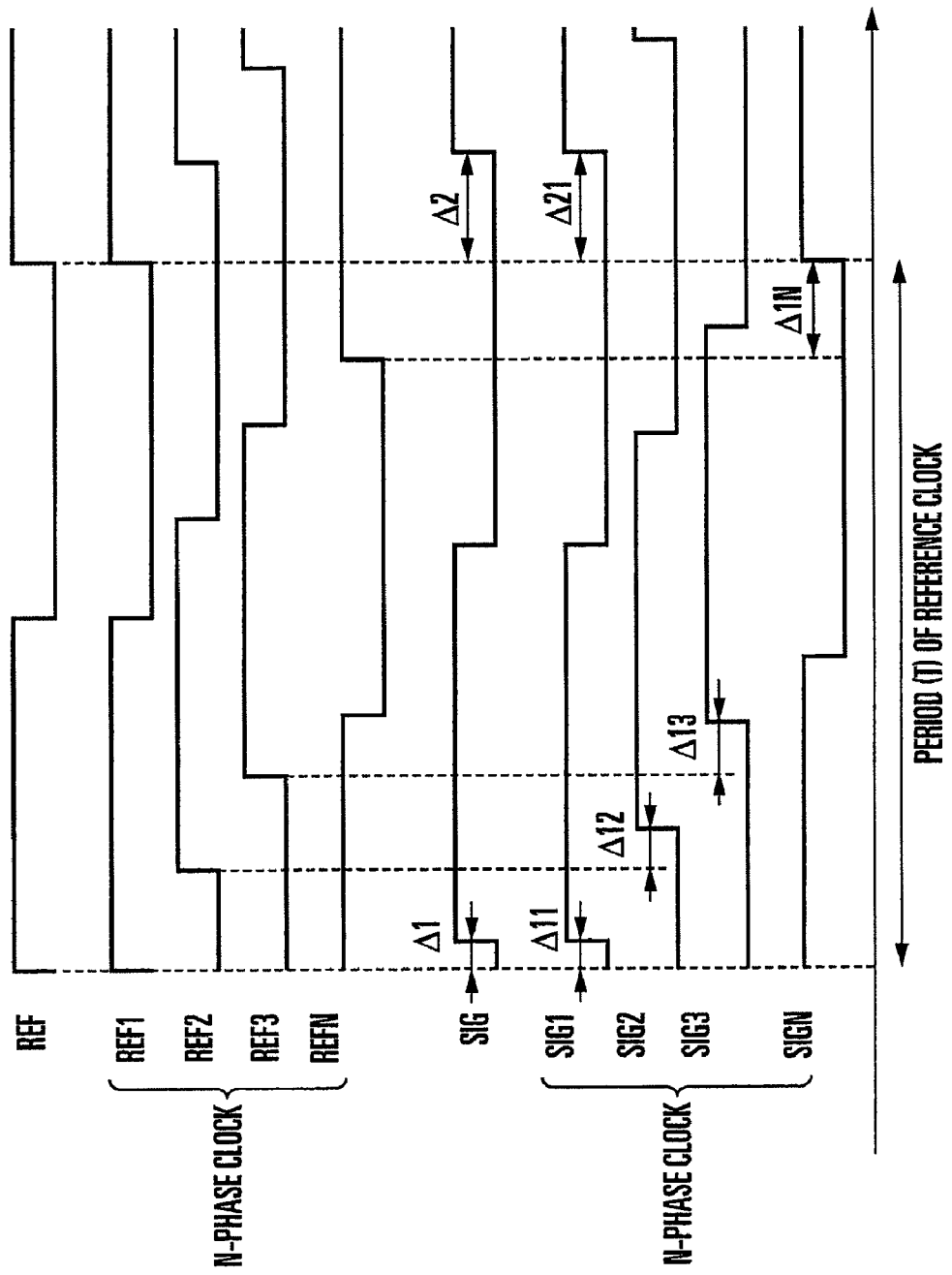
FIG. 12 is a timing chart showing N-phase clock signals generated by an N-phase clock conversion circuit.

As shown in FIG. 12, letting Δ1 be the time difference between the rising clock edge of the first reference signal REF and the rising clock edge of the first to-be-measured signal SIG, and Δ2 be the time difference between REF and SIG at the second rising clock edge, a phase difference (time difference) Δ1k between the N interpolated signals $REF_K$ and $SIG_K$ generated between these two clocks is represented by $$\Delta 1k = [\{N-(k-1)\}/N] \times \Delta 1 + \{(k-1)/N\} \times \Delta 2 \quad (3)$$

As is obvious from equation (3), interpolated phases Δ11, Δ12, ..., Δ1N in one clock period are the values obtained by performing linear interpolation between Δ1 and Δ2.

Figure 13:
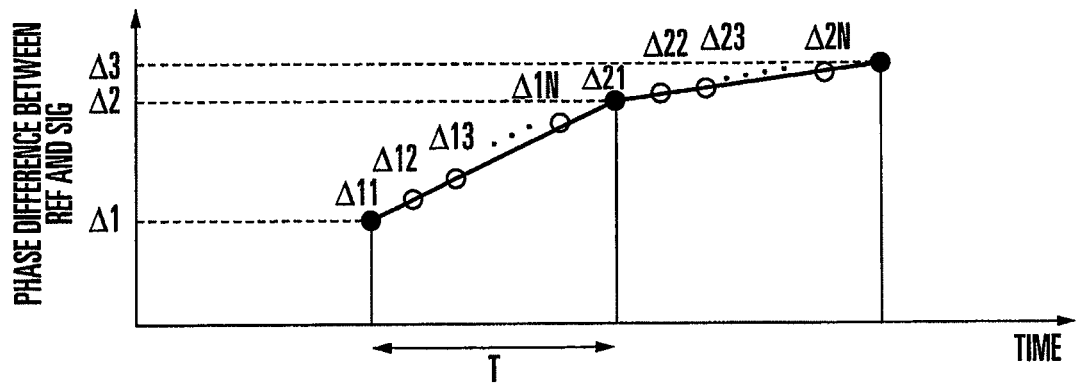
FIG. 13 is a graph showing the phase differences between N-phase clock signals along the time axis.
Figure 14:
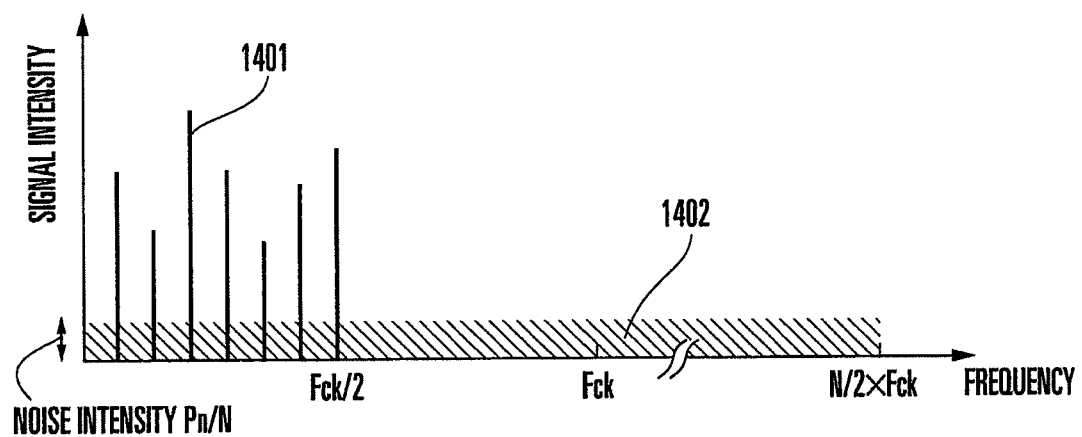
FIG. 14 is a graph showing a frequency spectrum as a measurement result obtained by the jitter measuring device shown in FIG. 8.

FIG. 13 shows the graph obtained by rewriting equation (3) into the relationship between the time and jitter values. This embodiment measures jitter N times (=N-times oversampling) per period by linearly interpolating jitter which originally occurs once per period. FIG. 14 shows this in a spectral form. With N-times oversampling, the sampling frequency becomes N×Fck (Fck is the frequency (=1/T) of the reference signal REF). In the case of oversampling, the spectrum of quantization noise 1402 uniformly spreads from 0 to N/2× Fck, and the quantization noise 1402 per unit frequency is reduced to 1/N as compared with the case in which no oversampling is performed. This makes it possible to reduce only the quantization noise without attenuating the clock signal component by using a low-pass filter having a characteristic that cuts off only a high-frequency component while transmitting a signal 1401 whose spectrum exists at Fck/2 or less.

Figure 15:
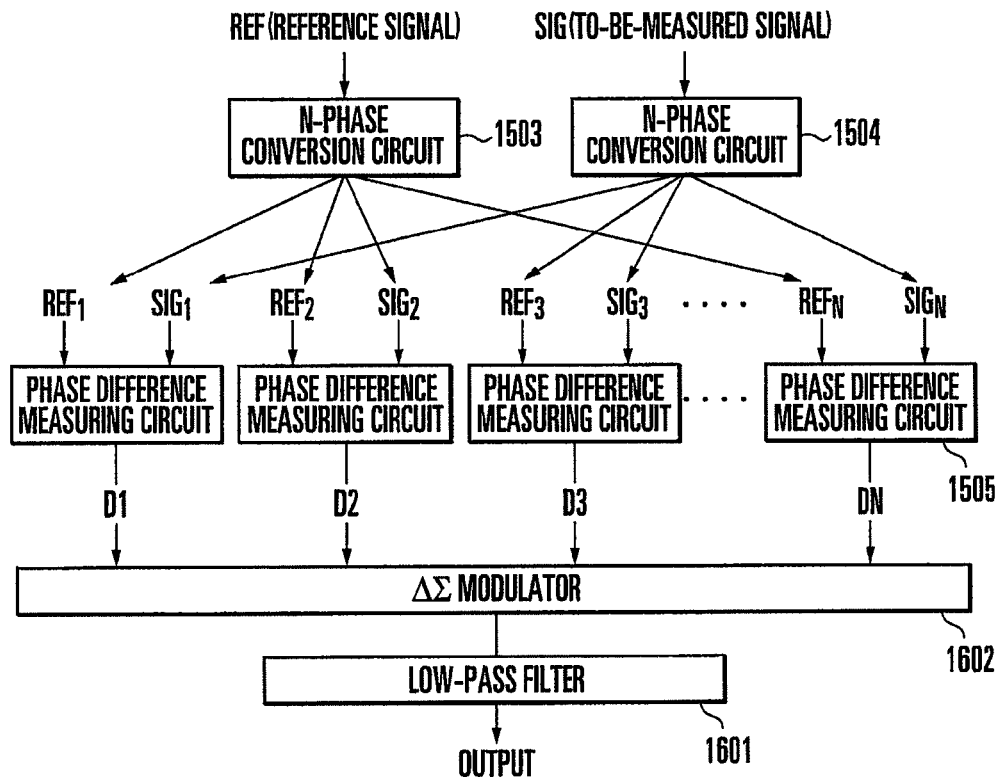
FIG. 15 is a block diagram showing a modification of the jitter measuring device shown in FIG. 8.
Figure 16:
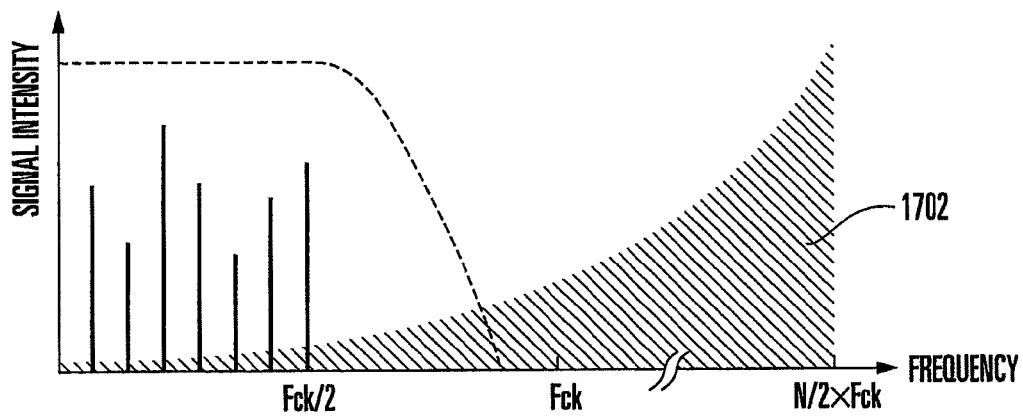
FIG. 16 is a graph showing a frequency spectrum as a measurement result obtained by the jitter measuring device shown in FIG. 15.
Figure 17:
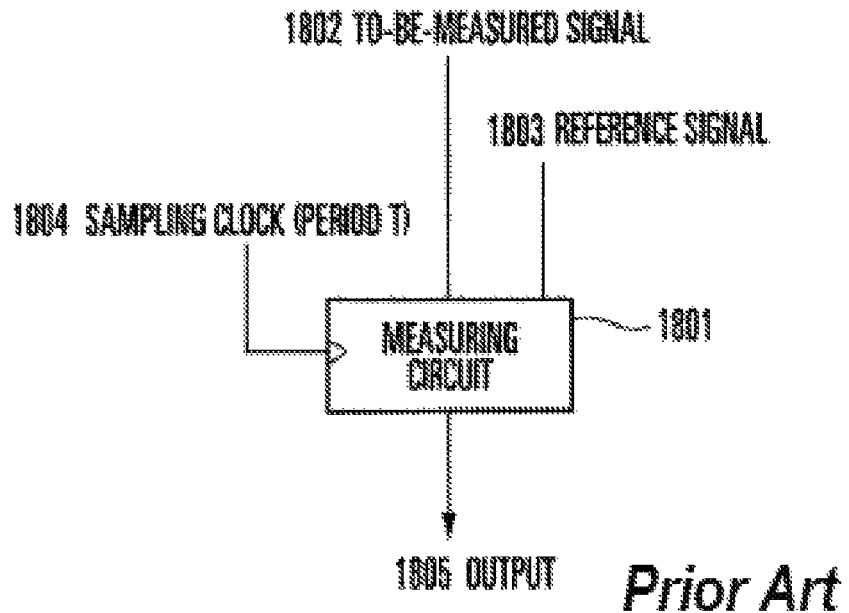
FIG. 17 is a block diagram showing a conventional measuring circuit.
Figure 18:
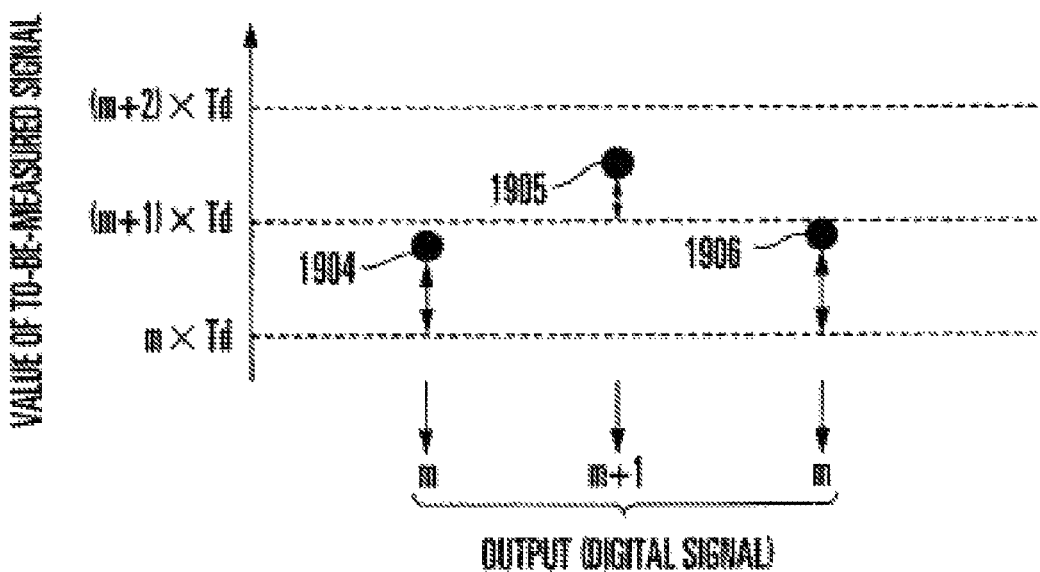
FIG. 18 is a view showing quantization noise generated when the conventional measuring circuit is used.
Figure 19:
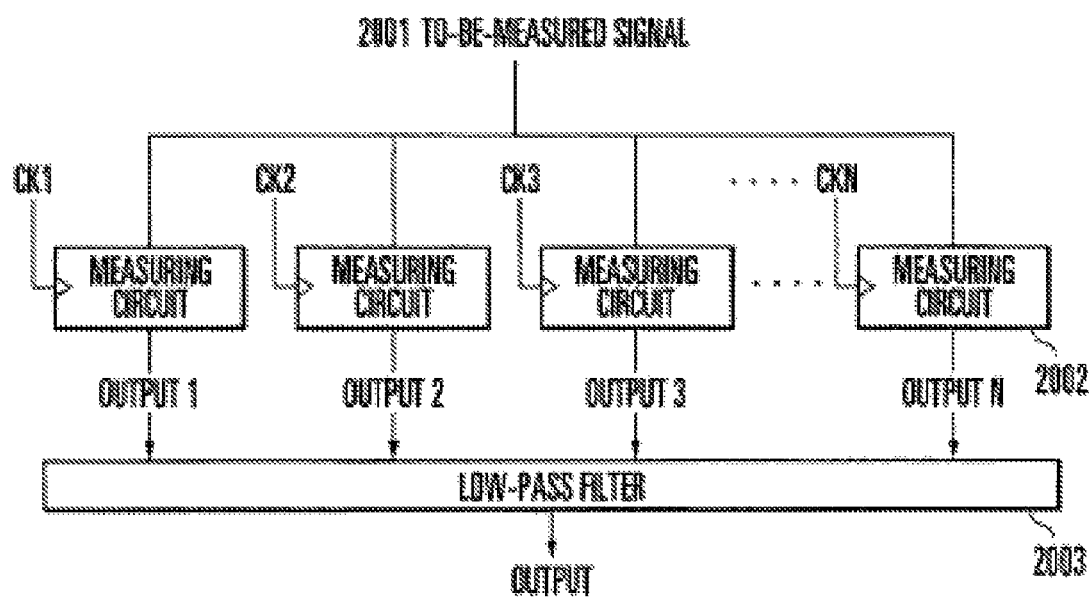
FIG. 19 is a block diagram showing an example of the arrangement of a circuit for implementing oversampling for a conventional continuous signal.
Figure 20:
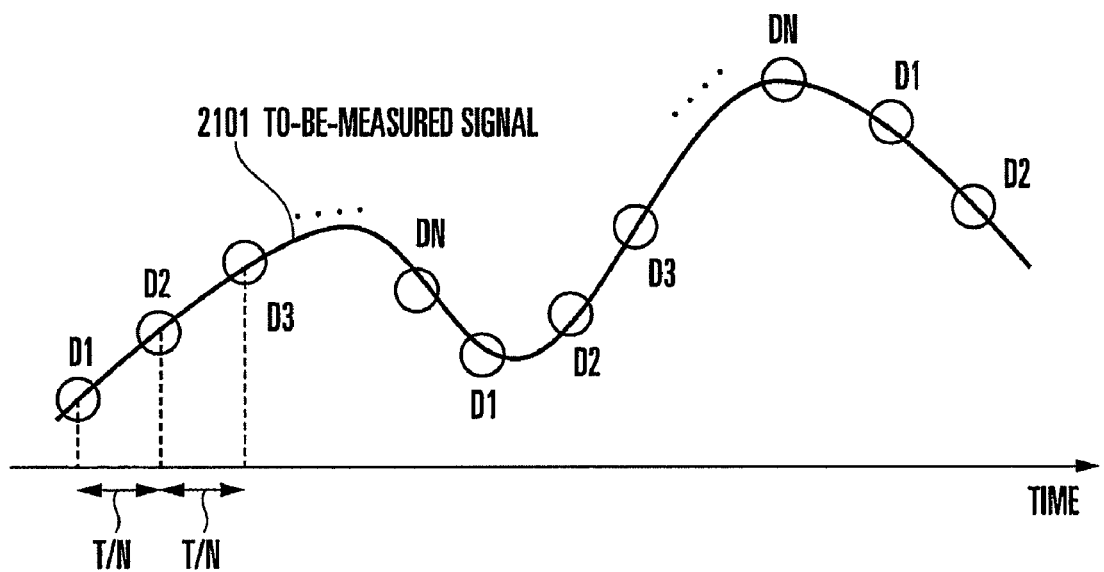
FIG. 20 is a graph showing a signal along the time axis when oversampling is performed.
Figure 21:
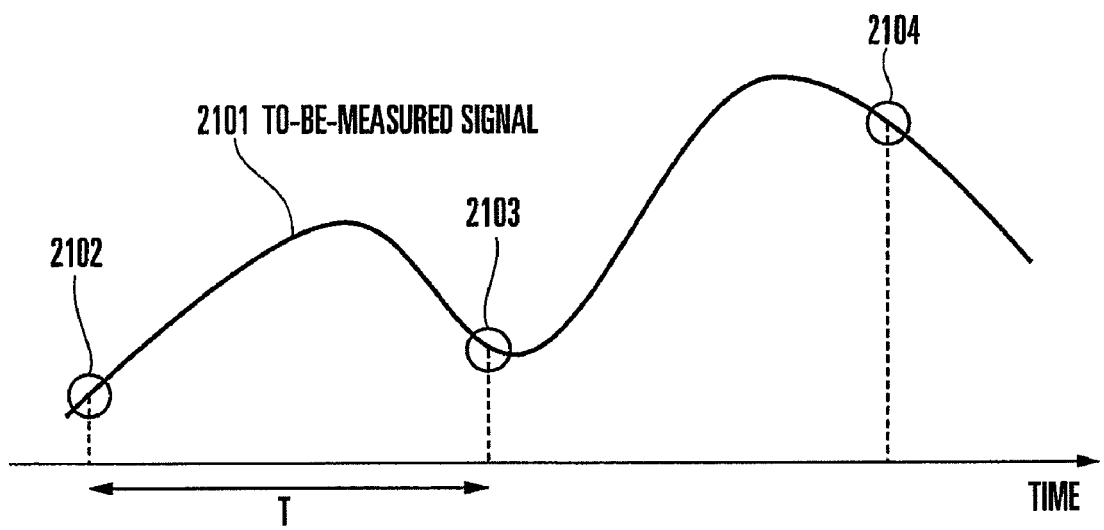
FIG. 21 is a graph showing a signal along the time axis when no oversampling is performed.
Figure 22:
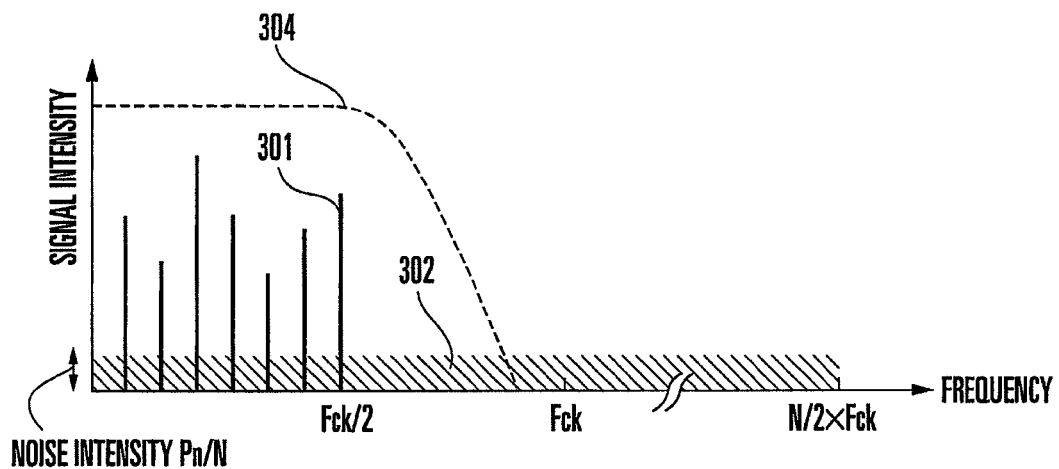
FIG. 22 is a graph showing a frequency spectrum when oversampling is performed.
Figure 23:
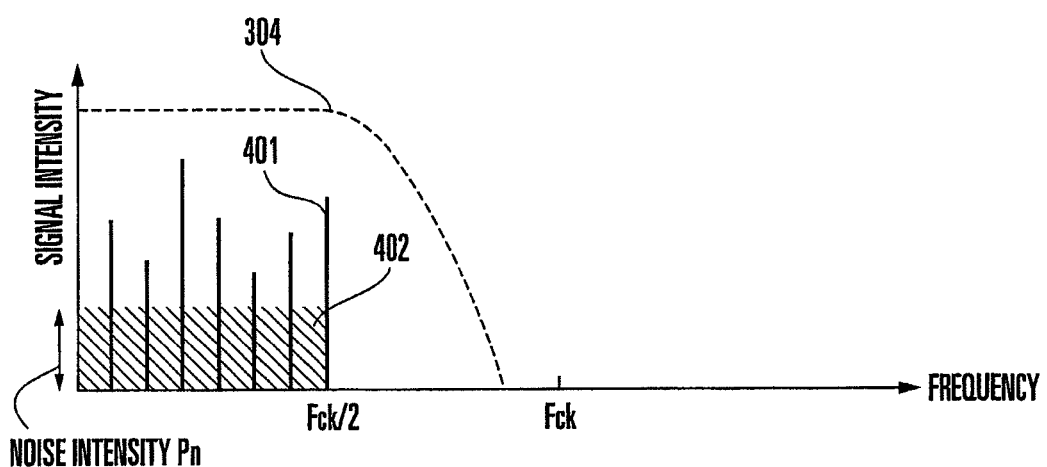
FIG. 23 is a graph showing a frequency spectrum when no oversampling is performed.

In addition, when a ΔΣ modulator 1602 is connected to the output sides of the N phase difference measuring devices 1505 as shown in FIG. 15, the frequency spectrum of the measurement result is obtained as shown in FIG. 16 such that a noise component 1702 disproportionately overlaps the high-frequency component. This increases the amount of noise which can be removed by a low-pass filter 1601 connected to the output side of the ΔΣ modulator 1602, resulting in obtaining a better signal-to-noise ratio.

Obviously, the present invention is not limited to the above embodiments, and each embodiment can be properly changed within the range of the technical idea of the present invention. The measuring device according to each embodiment can comprise an integrated circuit formed on a semiconductor substrate.

As has been described above, the signal measuring device according to the present invention comprises the interpolated signal generating circuit and the measuring circuits. The interpolated signal generating circuit receives discrete signals as measurement targets and generates interpolated signals of two consecutive discrete signals. The measuring circuits receive the discrete signals and the interpolated signals generated by the interpolated signal generating circuit, and output the results obtained by measuring the discrete signals and the interpolated signals. Since the interpolated signals generated by the interpolated signal generating circuit become measurement targets, oversampling measurement can be substantially implemented. This improves the signal-to-noise ratio.

The interpolated signal generating circuit can be a signal interpolation circuit which generates a plurality of interpolated signals by interpolating two consecutive discrete signals at equal intervals. An example of the signal interpolation circuit is a phase interpolation circuit which generates multiphase clocks from two-phase clocks.

The above signal measuring device can further comprise data conversion circuits which receive output signals from the measuring circuits and output the signals upon removing noise from them. Examples of the data conversion circuit are a low-pass filter which removes a high-frequency component from an output signal from a measuring circuit and outputs the resultant signal, and a ΔΣ modulation circuit which performs ΔΣ modulation for an output signal from a measuring circuit and outputs the resultant signal. Using these data conversion circuits can further improve the signal-to-noise ratio.

The interpolated signal generating circuit comprises first and second N-phase clock conversion circuits (N is an integer equal to or more than 2). The first N-phase clock conversion circuit receives first clock signals, and generates N (first to Nth) interpolated signals by interpolating the phase difference between two consecutive first clock signals with k:N−k (k are all integers from 1 to N). The second N-phase clock conversion circuit receives second clock signals equal in average period to the first clock signals, and generates N (first to Nth) interpolated signals by interpolating the phase difference between two consecutive second clock signals with k:N−k. The measuring circuits receive the first to Nth interpolated signals from the first and second N-phase clock conversion circuits, respectively, measure the phase differences between the interpolated signals with the same numbers, and output the resultant data. Each measuring circuit, in particular, comprises N (first to Nth) phase difference measuring circuits. The kth phase difference measuring circuit receives the kth interpolated signals from the first and second N-phase clock conversion circuits, measures the phase difference between the interpolated signals, and outputs the resultant data. With this arrangement, the phase difference between two clock signals can be accurately measured. Note that the Nth interpolated signal is obtained by interpolating the phase difference between clock signals with N:0. That is, this signal is identical to the initially input discrete signal. In addition, that k are all integers from 0 to N−1 is synonymous with that k are all integers from 1 to N.

In addition, the above signal measuring device can comprise an integrated circuit formed on a semiconductor substrate. This is a general embodiment of the above signal measuring device. A discrete signal as a measurement target can be an analog value or a digital value with a resolution higher than that of each measuring circuit. Each measuring circuit can be a circuit which quantizes an input discrete signal and interpolated signal into digital signals and outputs them.

The signal measuring device according to the present invention can be formed as the following integrated circuit.

A first integrated circuit is a measuring circuit which receives discrete signals generated at every discrete time (interval T) and outputs the measurement results on the values of the signals, and comprises an interpolated signal generating circuit which generates interpolated values of the values of two consecutive discrete signals, one or a plurality of measuring circuits which receive the interpolated values and output the results obtained by measuring the interpolated values, and a data conversion circuit which receives the output data sequences and converts them into data sequences to be output to the outside of the measuring circuit.

According to a second integrated circuit, the interpolated signal generating circuit in the first integrated circuit comprises a signal interpolation circuit which converts the consecutive first and second signal values, of the signals input at every time T, into n signal values which are internally divided at equal intervals.

According to a third integrated circuit, the data conversion circuit in the first or second integrated circuit comprises a low-pass filter which outputs a signal obtained by removing a high-frequency component of an input signal.

According to a fourth integrated circuit, the data conversion circuit in any one of the first to third integrated circuits comprises a ΔΣ modulation circuit which modulates an input data sequence and a low-pass filter which outputs a signal obtained by removing a high-frequency component of an input signal.

A fifth integrated circuit is a time difference measuring circuit, in any one of the first to fourth integrated circuits, which measures the time difference between the timings of the first and second clocks whose average periods are both T, and comprises a first interpolated signal generating circuit which receives first clocks and generates an interpolated phase between the phases of two consecutive signals from phases, a second interpolated signal generating circuit which receives second clocks and generates an interpolated phase between the phases of two consecutive signals from their phases, a measuring circuit which receives the kth (k is an arbitrary integer) output signal from the first interpolated signal generating circuit and the kth output signal from the second interpolated signal generating circuit, and measures the phase difference between the two input signals, and a data conversion circuit which receives an output from the measuring circuit and converts it into a data sequence which can be output to the outside of the integrated circuit.

According to a sixth integrated circuit, the interpolated signal generating circuit in the fifth integrated circuit is an n-phase clock generator which generates n-phase clocks having n interpolated phases between the phases of the first and second clocks from the phases of the two consecutive clock signals.

According to a seventh integrated circuit, the interpolated signal generating circuit in the fifth or sixth integrated circuit generates n intermediate phases (A1+k×(A2−A1)/n:k is an integer from 1 to n) from phases A1 and A2 of adjacent two clocks by using a phase interpolator.

The signal-to-noise ratio of the quantized digital signal (D1), which is the result obtained by measuring an input signal (SIG) using the measuring circuit is degraded by quantization noise. If, therefore, interpolated signals are generated and quantized digital signals (D1 to DN) are generated for the respective interpolated signals before the signals SIG are input to the measuring circuits, the signal-to-noise ratio can be improved. Note that a discrete signal is a temporally discrete signal (a signal that occurs only at every period T), and is not limited to a signal itself generated at every time T (can take an arbitrary real number).

The invention claimed is:
1. A signal measuring device comprising:
an interpolated signal generating circuit which receives discrete signals as measurement targets and generates signals interposing in between two consecutive discrete signals to output the thus generated signals; and
a measuring circuit which receives the interpolated signals output from said interpolated signal generating circuit, and outputs results obtained by measuring the interpolated signals,
wherein said interpolated signal generating circuit comprises a first N phase clock conversion circuit, N is an integer not less than 2, and a second N phase clock conversion circuit,
said first N phase clock conversion circuit receives first clock signals, and generates N interpolated signals including a first interpolated signal to an Nth interpolated signal by interpolating a phase difference between two consecutive first clock signals with k:N−k, k are all integers from 1 to N, said second N phase clock conversion circuit receives second clock signals equal in average period to the first clock signals, and generates N interpolated signals including a first interpolated signal to an Nth interpolated signal by interpolating a phase difference between two consecutive second clock signals with k:N−k, and the measuring circuit receives a first interpolated signal to an Nth interpolated signal from said first N phase clock conversion circuit and said second N phase clock conversion circuit, and measures and outputs phase differences between interpolated signals with the same numbers.

2. A signal measuring device according to claim 1, characterized in that said interpolated signal generating circuit comprises a signal interpolation circuit which generates a plurality of interpolated signals by interpolating two consecutive discrete signals at equal intervals.

3. A signal measuring device according to claim 1, characterized by further comprising a data conversion circuit which receives output signals from said measuring circuit, and outputs the output signals upon removing noise therefrom.

4. A signal measuring device according to claim 3, characterized in that said data conversion circuit comprises a low pass filter which outputs output signals from said measuring circuit upon removing a high frequency component therefrom 5. A signal measuring device according to claim 3, characterized in that said data conversion circuit comprises a $\Delta\Sigma$ modulation circuit which outputs output signals from said measuring circuit upon performing $\Delta\Sigma$ modulation therefor.

6. A signal measuring device according to claim 3, characterized in that said data conversion circuit comprises:
a $\Delta\Sigma$ modulation circuit which outputs output signals from said measuring circuit upon performing $\Delta\Sigma$ modulation therefor, and
a low pass filter which receives the output signals from said $\Delta\Sigma$ modulation circuit, and outputs the output signals upon removing a high frequency component therefrom.

7. A signal measuring device according to claim 1, characterized in that
said measuring circuit comprises N phase difference measuring devices including a first phase difference measuring device to an Nth phase difference measuring device, and
said kth phase difference measuring device receives kth interpolated signals from said first N phase clock conversion circuit and said second N phase clock conversion circuit, and measures and outputs a phase difference between the interpolated signals.

8. A signal measuring device according to claim 1, characterized in that said device comprises an integrated circuit formed on a semiconductor substrate.

9. A signal measuring device according to claim 1, characterized in that said measuring circuit quantizes input interpolated signals into digital signals and outputs the signals.

10. A signal measuring device according to claim 1, wherein said measuring circuit comprises N phase difference measuring devices including a first phase difference measuring device to an Nth phase difference measuring device.

* * * * *